United States Patent
Kim et al.

(10) Patent No.: US 11,996,823 B2
(45) Date of Patent: May 28, 2024

(54) AIR-GAP TYPE FILM BULK ACOUSTIC RESONATOR

(71) Applicant: WISOL CO., LTD., Gyeonggi-do (KR)

(72) Inventors: Byung Hun Kim, Gyeonggi-do (KR);
Jong Hyeon Park, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 735 days.

(21) Appl. No.: 17/183,487

(22) Filed: Feb. 24, 2021

(65) Prior Publication Data

US 2022/0131524 A1    Apr. 28, 2022

(30) Foreign Application Priority Data

Oct. 27, 2020    (KR) .................. 10-2020-0140116

(51) Int. Cl.
*H03H 9/17*    (2006.01)
*H03H 9/13*    (2006.01)

(52) U.S. Cl.
CPC .............. *H03H 9/171* (2013.01); *H03H 9/13* (2013.01)

(58) Field of Classification Search
CPC ...... H03H 9/171; H03H 9/13; H03H 9/02118; H03H 9/02157; H03H 9/132; H03H 9/173; H03H 9/17; H03H 9/25; H03H 9/15

See application file for complete search history.

(56) References Cited

U.S. PATENT DOCUMENTS

| | | | |
|---|---|---|---|
| 9,608,592 B2 * | 3/2017 | Bi | H03H 9/171 |
| 10,784,838 B2 * | 9/2020 | Choi | H03H 3/02 |
| 2017/0179924 A1 | 6/2017 | Bi et al. | |
| 2017/0338799 A1 * | 11/2017 | Ruby | H03H 9/171 |

FOREIGN PATENT DOCUMENTS

| | | |
|---|---|---|
| KR | 10-2004-0102390 A | 12/2004 |
| KR | 10-2019-0034838 A | 4/2019 |

OTHER PUBLICATIONS

Taniguchi et al. "An Air-Gap Type FBAR Filter Fabricated Using a Thin Sacrificed Layer on a Flat Substrate" 2007 IEEE Ultrasonics Symposium, pp. 600-603 (Year: 2007).*
Office Action from corresponding Korean Patent Application No. 10-2020-0140116, dated Nov. 10, 2022.

* cited by examiner

*Primary Examiner* — Emily P Pham
(74) *Attorney, Agent, or Firm* — Harness, Dickey & Pierce, P.L.C.

(57) ABSTRACT

Disclosed is an air-gap type film bulk acoustic resonator (FBAR) including a substrate including an air-gap portion on a top surface, a lower electrode having a polygonal plate shape above the substrate and configured to surround a top of the air-gap portion, a piezoelectric layer formed above the lower electrode, and an upper electrode formed above the piezoelectric layer. Here, the lower electrode includes an electrode non-deposited area formed between one side plate boundary surface of the polygonal plate and one side air-gap boundary surface of the air-gap portion to expose one part of a top of the air-gap portion.

7 Claims, 7 Drawing Sheets

AIR-GAP TYPE FILM BULK ACOUSTIC RESONATOR

CROSS-REFERENCE TO RELATED APPLICATION

This application claims priority to and the benefit of Korean Patent Application No. 10-2020-140116, filed on Oct. 27, 2020, the disclosure of which is incorporated herein by reference in its entirety.

FIELD

The present invention relates to an air-gap type thin film bulk acoustic resonator (FBAR) used for a filter, a duplexer, and the like for communication in a radio frequency (RF) band, and more particularly, to an air-gap type FBAR.

BACKGROUND

Wireless mobile communication technology requires a variety of radio frequency (RF) components capable of efficiently transmitting information within a limited frequency band. Particularly, among RF components, a filter is one of essential components used in mobile communication technology and enables high-quality communication by selecting a signal needed by a user among a plurality of frequency bands or filtering a signal to be transmitted.

Currently, a dielectric filter and a surface acoustic wave (SAW) filter are used most as an RF filter for wireless communication. The dielectric filter has advantages such as a high dielectric constant, a low insertion loss, stability at a high temperature, high vibration resistance, and high shock resistance. However, the dielectric filter has limitations in miniaturization and monolithic microwave integrated circuit (MMIC) which are recent trends of technology development. Also, an SAW filter has a small size in comparison to the dielectric filter, easily processes a signal, has a simple circuit, and is manufactured using a semiconductor process so as to facilitate mass production. Also, the SAW filter has an advantage of transmitting and receiving high-grade information due to higher side rejection within a passband in comparison to the dielectric filter. However, since an SAW filtering process includes an exposure process using ultraviolet (UV), there is a disadvantage in which a line width of an interdigital transducer (IDT) has a limitation of about 0.5 μm. Accordingly, there is a problem in which it is impossible to cover an ultrahigh frequency band of 5 GHz or more using the SAW filter. Basically, there is a difficulty in forming an MM IC structure and a single chip on a semiconductor substrate.

In order to overcome the above limitations and problems, a film bulk acoustic resonator (FBAR) filter integrated with other active devices on an existing semiconductor (Si or GaAs) substrate to completely implement a frequency control circuit as an MMIC is provided.

The FBAR is a thin film device which is low-cost, small-sized, and features high quality coefficient so as to be applicable to a wireless communication device, a military-use radar in a variety of frequency bands of 900 MHz to 10 GHz. Also, the FBAR is reduced in size as one-several hundredth of the dielectric filter and a lumped constant (LC) filter and has a very smaller insertion loss than the SAW filter. Accordingly, it is apparent that the FBAR is most adequate device for an MMIC which requires high stability and a high quality coefficient.

An FBAR filter is formed by depositing zinc oxide (ZnO), aluminum nitride (AlN), or the like which is a piezoelectric-dielectric material on silicon (Si) or gallium arsenide (GaAs) which is a semiconductor substrate using an RF sputtering method and causes resonation due to a piezoelectric property. That is, the FBAR generates resonance by depositing a piezoelectric film between both electrodes and causing a bulk acoustic wave.

A variety of forms of FBAR structures have been studied until now. In the case of a membrane type FBAR, a silicon oxide film ($SiO_2$) is deposited on a substrate and a membrane layer is formed using a cavity formed through isotropic etching on an opposite side of the substrate.

Also, a lower electrode is formed above the silicon oxide film, a piezoelectric layer is formed by depositing a piezoelectric material above the lower electrode using an RF magnetron sputtering, and an upper electrode is formed above the piezoelectric layer.

The above membrane type FBAR has an advantage of less dielectric loss and power loss due to the cavity. However, the membrane type FBAR has problems in which an area occupied by a device is large due to a directivity of the silicon substrate and a yield is decreased by damages due to low structural stability in a follow-up packaging process. Accordingly, recently, in order to reduce a loss caused by the membrane and to simplify a device manufacturing process, an air-gap type FBAR and a Bragg reflector type FBAR have appeared.

The Bragg reflector type FBAR has a structure in which a reflection layer is formed by depositing materials having a high elastic impedance difference on every other layer on a substrate and a lower electrode, a piezoelectric layer, and an upper electrode are sequentially deposited. Here, elastic wave energy which has passed through the piezoelectric layer is not transferred toward the substrate and all reflected by the reflection layer so as to generate efficient resonation. Although the Bragg reflector type FBAR is structurally firm and has no stress caused by bending, it is difficult to form four or more reflection layers having a precise thickness for total reflection and large amounts of time and cost are necessary for manufacturing.

Meanwhile, in an existing air-gap type FBAR having a structure in which a substrate and a resonance portion are isolated using an air gap instead of a reflection layer, a sacrificial layer is implemented by performing isotropic etching on a surface of a silicon substrate and is surface-polished through chemical-mechanical polishing, an insulation layer, a lower electrode, a piezoelectric layer, and an upper electrode are sequentially deposited, and an air gap is formed by removing the sacrificial layer through a via hole so as to implement an FBAR.

In general, a piezoelectric layer is formed between upper and lower electrodes in an FBAR structure, and the upper and lower electrodes are installed in only a necessary area so as to use a piezoelectric effect. Accordingly, a mechanical anchor loss is great such that reduction in mechanical energy is caused.

In the case of the upper electrode or lower electrode, molybdenum (Mo), ruthenium (Ru), tungsten (W), and the like are used to increase acoustic impedance. Since a skin depth of an electrode material is determined according to a frequency of a filter and a thickness significantly smaller than the skin depth is generally used, it is impossible to transfer charges at a resonance point of the piezoelectric layer, a quality factor is reduced.

RELATED ART DOCUMENT

Patent Document

Patent Document 1: Korean Patent Publication No. 10-2004-0102390 (published on Dec. 8, 2004)

SUMMARY

The present invention is directed to providing an air-gap type film bulk acoustic resonator (FBAR) which improves resonance properties.

According to an aspect of the present invention, there is provided an air-gap type film bulk acoustic resonator (FBAR) including a substrate including an air-gap portion on a top surface, a lower electrode having a polygonal plate shape above the substrate and configured to surround a top of the air-gap portion, a piezoelectric layer formed above the lower electrode, and an upper electrode formed above the piezoelectric layer. Here, the lower electrode includes an electrode non-deposited area formed between one side plate boundary surface of the polygonal plate and one side air-gap boundary surface of the air-gap portion to expose one part of a top of the air-gap portion.

A part of the one side plate boundary surface may form a groove with a certain width in a direction toward a center of the air-gap portion to form the electrode non-deposited area between the one side plate boundary surface and the one side air-gap boundary surface.

A part of the one side air-gap boundary surface may protrude with a certain width in a direction opposite to a center of the air-gap portion to form the electrode non-deposited area between the one side plate boundary surface and the one side air-gap boundary surface. The certain width may be 0.5 µm to 5.0 µm.

The air-gap type FBAR may include an air bridge in which an air space is formed between the piezoelectric layer and the upper electrode above the electrode non-deposited area.

A distance between the one side plate boundary surface and one side bridge boundary surface of the air bridge located above the air-gap portion may be 2.0 µm to 6.0 µm.

One side bridge boundary surface of the air bridge may be located above the air-gap portion, and another side bridge boundary surface of the air bridge may be located above the substrate where the air-gap portion is not formed.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

Hereinafter, exemplary embodiments of the present invention will be described in detail with reference to the attached drawings.

Embodiments of the present invention are provided to more completely explain the present invention to one of ordinary skill in the art. The embodiments of the present invention may be changed in a variety of shapes, and the scope of the present invention should not be understood as being limited to the following embodiments. The embodiments are provided to make the present disclosure more substantial and complete and to completely transfer the concept of the present invention to those skilled in the art.

The terms used herein are used to explain particular embodiments and not intended to limit the present invention. As used herein, singular expressions, unless clearly defined otherwise in context, include plural expressions. Also, as used herein, the term "and/or" includes any and all combinations or one of a plurality of associated listed items. Also, hereinafter, the embodiments of the present invention will be described with reference drawings which schematically illustrate the embodiments of the present invention.

Figure 1:
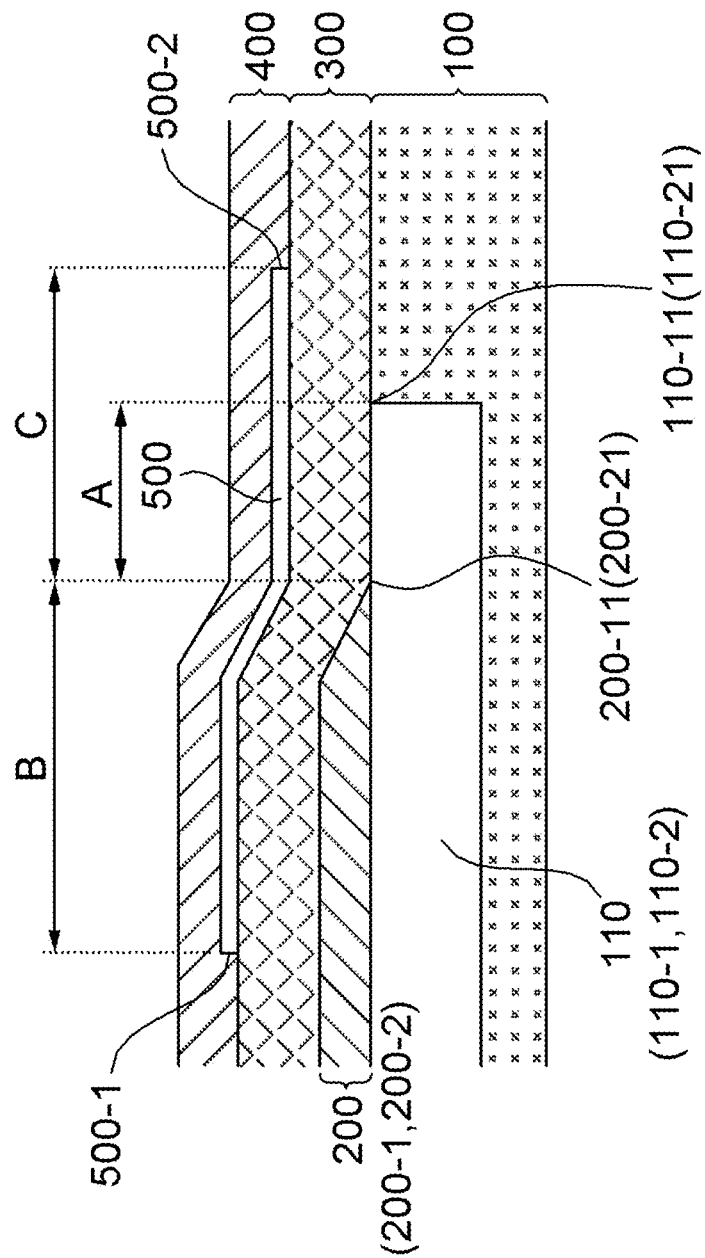
FIG. 1 is a cross-sectional view illustrating one embodiment of an air-gap type film bulk acoustic resonator (FBAR) according to the present invention.

FIG. 1 is a cross-sectional view illustrating one embodiment of an air-gap type film bulk acoustic resonator (FBAR) according to the present invention. It will be defined that like reference numerals among following reference numerals correspond to elements having the same function or structure.

Referring to FIG. 1, the air-gap type FBAR includes a substrate 100, an air-gap portion 110, a lower electrode 200, a piezoelectric layer 300, an upper electrode 400, and an air bridge 500. When a signal is applied between the lower electrode 200 and the upper electrode 400, the air-gap type FBAR resonates with respect to a frequency of natural oscillation according to a thickness of the piezoelectric layer 300 while part of electrical energy input and transferred between the two electrodes is converted into mechanical energy according to a piezoelectric effect and is converted again into electrical energy.

The substrate 100 is a semiconductor substrate and may employ a general silicon wafer. Preferably, a high resistivity silicon substrate (HRS) may be used. An insulation layer (not shown) may be formed on a top surface of the substrate 100. As the insulation layer, a thermal oxidation layer, which is easily growable on the substrate 100, may be employed or an oxide film or a nitride film formed using a general deposition process such as chemical vapor deposition and the like may be selectively employed.

The air-gap portion 110 is formed by forming a cavity in the substrate 100, forming an insulation layer on the cavity, depositing a sacrificial layer above the insulation layer, planarizing the sacrificial layer above the insulation layer through etching, and removing the sacrificial layer. Here, the sacrificial layer is formed using a material such as polysilicon, zinc oxide (ZnO), and the like, which has excellent surface roughness and is formed or removed easily. As an example, polysilicon which has high surface roughness may be employed as the sacrificial layer. The polysilicon may be easily formed or removed and particularly may be removed using dry etching in a follow-up process.

The lower electrode 200 is formed above the substrate 100 where the sacrificial layer exists in the cavity. The lower electrode 200 is formed by depositing a certain material above the substrate 100 and patterning the deposited material. A material used for the lower electrode 200 includes a general conductive material such as a metal, and preferably, may include one of aluminum (Al), tungsten (W), gold (Au), platinum (Pt), nickel (Ni), titanium (Ti), chrome (Cr), palladium (Pd), and molybdenum (Mo). A thickness of the lower electrode 200 may be 10 to 1,000 nm.

The lower electrode 200 may be formed through patterning above the insulation layer and the sacrificial layer of the substrate 100. The lower electrode 200 may be formed above the substrate 100 to have a polygonal plate shape while surrounding a top of the air-gap portion 110. Here, the lower electrode 200 is deposited to surround only a part of the top of the air-gap portion 110 of the substrate 100 so as to form an electrode non-deposited area NA with respect to the air-gap portion 110.

Figure 2:
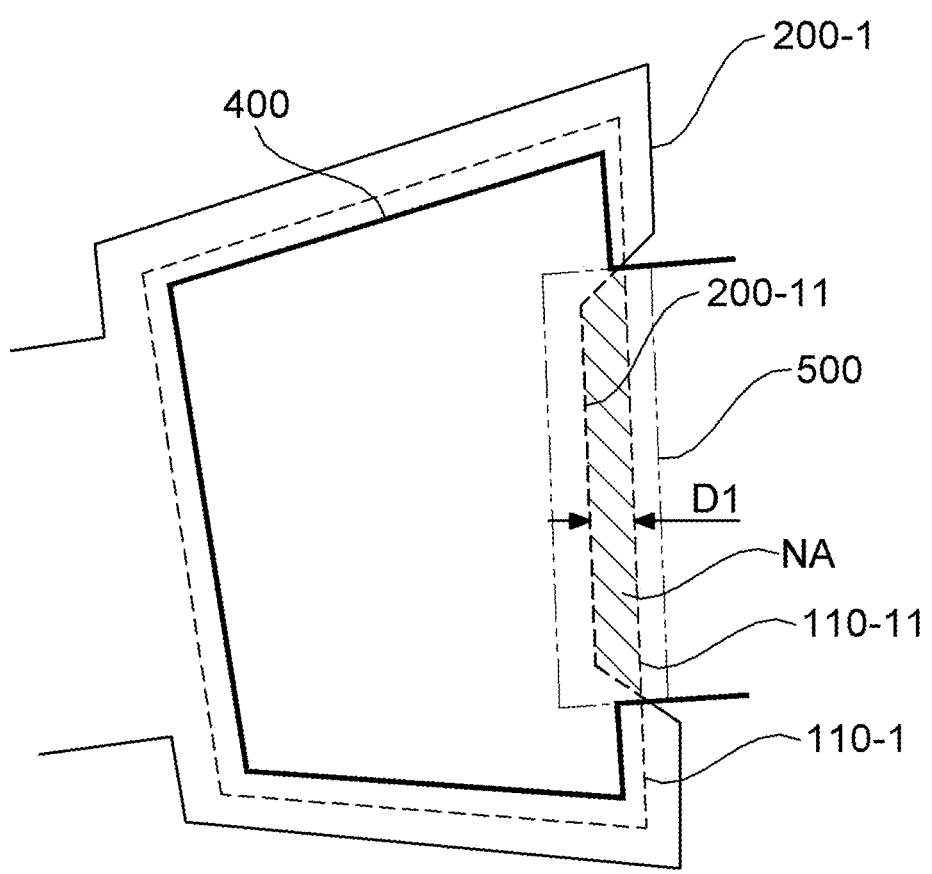
FIG. 2 is a plan view of one embodiment of the air-gap type FBAR shown in FIG. 1 when viewed from above.

FIG. 2 is a plan view of one embodiment of the air-gap type FBAR shown in FIG. 1 when viewed from above. In FIG. 2, a reference numeral of an air-gap portion is 110-1 and a reference numeral of a lower electrode is 200-1.

Referring to FIG. 2, a lower electrode 200-1 may include an electrode non-deposited area NA between one side plate boundary surface 200-11 of a polygonal plate and one side air-gap boundary surface 110-11 of the air-gap portion 110-1 to expose one part of the top of the air-gap portion 110-1.

Since a part of the one side plate boundary surface 200-11 forms a groove having a certain width in a direction toward a center of the air-gap portion 110-1, the electrode non-deposited area NA may be formed between the one side plate boundary surface 200-11 and the one side air-gap boundary surface 110-11.

Here, as shown in FIG. 2, the certain width corresponds to a distance D1 between the one side air-gap boundary surface 110-11 of the air-gap portion 110-1 and the one side plate boundary surface 200-11 corresponding to one end of the lower electrode 200-1. Here, the certain width may be 0.5 μm to 5.0 μm, and more particularly, be 1.3 μm to 3.0 μm. A shape around the one side plate boundary surface 200-11 of the lower electrode 200-1 may be tilted in a diagonal direction as shown in FIG. 1. A tilted angle thereof may be smaller than or equal to 50 degrees.

Figure 3:
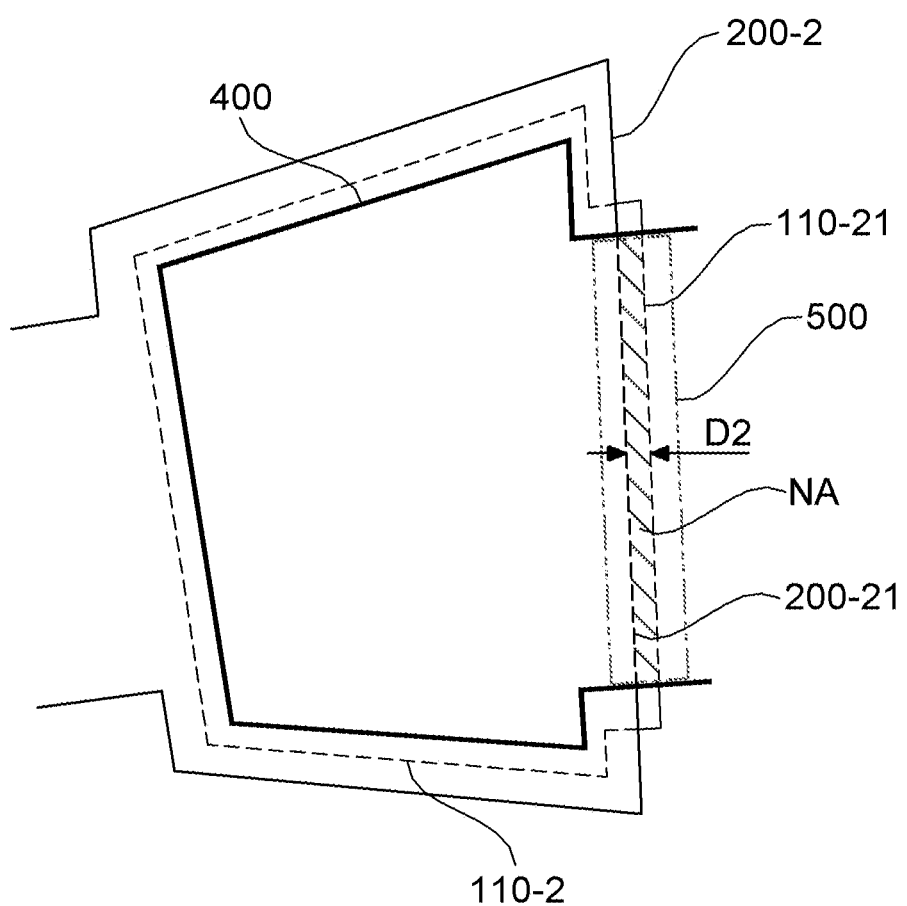
FIG. 3 is a plan view of another embodiment of the air-gap type FBAR shown in FIG. 1 when viewed from above.

FIG. 3 is a plan view of another embodiment of the air-gap type FBAR shown in FIG. 1 when viewed from above. In FIG. 3, a reference numeral of an air-gap portion is 110-2 and a reference numeral of a lower electrode is 200-2.

Referring to FIG. 3, a lower electrode 200-2 may include an electrode non-deposited area NA between one side plate boundary surface 200-21 of a polygonal plate and one side air-gap boundary surface 110-21 of the air-gap portion 110-2 to expose one part of a top of the air-gap portion 110-2.

Since a part of the one side air-gap boundary surface 110-21 of the air-gap portion 110-2 protrudes with a certain width in a direction opposite to a direction toward a center of the air-gap portion 110-2, an electrode non-deposited area NA may be formed between the one side plate boundary surface 200-21 and the one side air-gap boundary surface 110-21.

Here, as shown in FIG. 3, the certain width corresponds to a distance D2 between the one side air-gap boundary surface 110-21 of the air-gap portion 110-2 and the one side plate boundary surface 200-21 corresponding to one end of the lower electrode 200-2. Here, the certain width may be 0.5 μm to 5.0 μm, and more particularly, be 1.3 μm to 3.0 μm. A shape around the one side plate boundary surface 200-21 of the lower electrode 200-2 may be tilted in a diagonal direction as shown in FIG. 1. A tilt angle may be smaller than or equal to 50 degrees.

The piezoelectric layer 300 is formed above the lower electrode 200. The piezoelectric layer 300 may be formed by depositing a piezoelectric material above the lower electrode 200 and patterning the deposited piezoelectric material. As a general piezoelectric material, aluminum nitride (AlN) or ZnO may be used. A deposition method includes a radio frequency (RF) magnetron sputtering method, an evaporation method, and the like. A thickness of the piezoelectric layer 300 may be 200 to 5000 nm.

The upper electrode 400 is formed above the piezoelectric layer 300. When the sacrificial layer is formed on the piezoelectric layer 300 to form the air bridge 500, the upper electrode 400 may be formed even above the sacrificial layer. The upper electrode 400 may be formed by depositing a metal film for an upper electrode in a certain area above the piezoelectric layer 300 and then patterning the deposited metal film. The same material, same deposition method, and same patterning method as those of the lower electrode 200 may be used for forming the upper electrode 400. A thickness of the upper electrode 400 may be 5 to 1000 nm.

The air bridge 500 is an air space formed between the piezoelectric layer 300 and the upper electrode 400 above the electrode non-deposited area NA. One side bridge boundary surface 500-1 of the air bridge 500 may be located above the air-gap portion 110, and another side bridge boundary surface 500-2 of the air bridge 500 may be located above the substrate 100 where the air-gap portion 110 is not formed.

The air bridge 500 may be formed by forming a cavity by etching a partial area of the piezoelectric layer 300, depositing and planarizing a sacrificial layer above the cavity, and then removing the sacrificial layer or may be formed by forming a sacrificial layer above the piezoelectric layer 300, forming the upper electrode 400, and then removing the sacrificial layer. Here, the sacrificial layer is formed using a material such as polysilicon, ZnO, and the like, which has excellent surface roughness and is formed or removed easily.

Here, the air bridge 500 may include an air space to which a part of a top of the piezoelectric layer 300 and a part of a bottom of the upper electrode 400 are exposed. Referring to FIG. 1, the air bridge 500 has a shape in which the upper electrode 400 is partially exposed to the air space and the lower electrode 200 is not exposed to the air space. Also, the air space of the air bride 500 and an air space of the air-gap portion 110 formed in the substrate 100 may be blocked by the piezoelectric material of the piezoelectric layer 300.

The one side bridge boundary surface 500-1 of the air bridge 500 may be located above the air-gap portion 110, and the other side bridge boundary surface 500-2 of the air bridge 500 may be located above the substrate 100 where the air-gap portion 110 is not formed. That is, although the one side bridge boundary surface 500-1 which forms the air space of the air bridge 500 meets the air space of the air-gap portion 110 when a virtual vertical surface is extended, the other side bridge boundary surface 500-2 does not meet the air space of the air-gap portion 110 and meets only the substrate 100 when a virtual vertical surface is extended.

In the air bridge 500, a distance between the one side bridge boundary surface 500-1 located above the air-gap portion 110 and the one side plate boundary surface 200-11 or 200-21 may be 2.0 μm to 6.0 μm, and more particularly, 4.0 μm to 4.7 μm.

Accordingly, in the case of an existing FBAR having a structure in which a low electrode completely covers a cavity, an upper structure of an air bridge is separated as an air layer and freely oscillates but a lower structure of the air bridge has a lot of parts fixed to an Si wafer such that lateral waves pass through an active area and escape from the lower structure of the air bridge. However, according to the present invention, since an escape of lateral waves may be prevented by using structural resonance of an upper structure and a lower structure of the air bridge 500, a Q factor may be improved.

Meanwhile, although not shown in the drawings, a pad layer may be formed to be applied to parts of the above-described lower electrode 200, piezoelectric layer 300, and upper electrode 400. The pad layer functions as a cover for protecting the lower electrode 200, the piezoelectric layer 300, and the upper electrode 400.

The above-described air-gap type FBAR has a structure in which an RF signal input to the upper electrode 400 is output to the lower electrode 200 via the piezoelectric layer 300. Here, since the piezoelectric layer 300 has a uniform resonance frequency, electrical impedance is minimized at a frequency in coincidence with the piezoelectric layer 300 among input RF signals and is maximized at an anti-resonance frequency. Such resonators are combined in a series and shunt so that a desired RF signal is output through a ladder-shaped circuit structure and other frequencies become extinct. Accordingly, the lower electrode 200, the piezoelectric layer 300, and the upper electrode 400 are configured as described above so as to implement an FBAR filter having a uniform main frequency and bandwidth.

Figure 4:
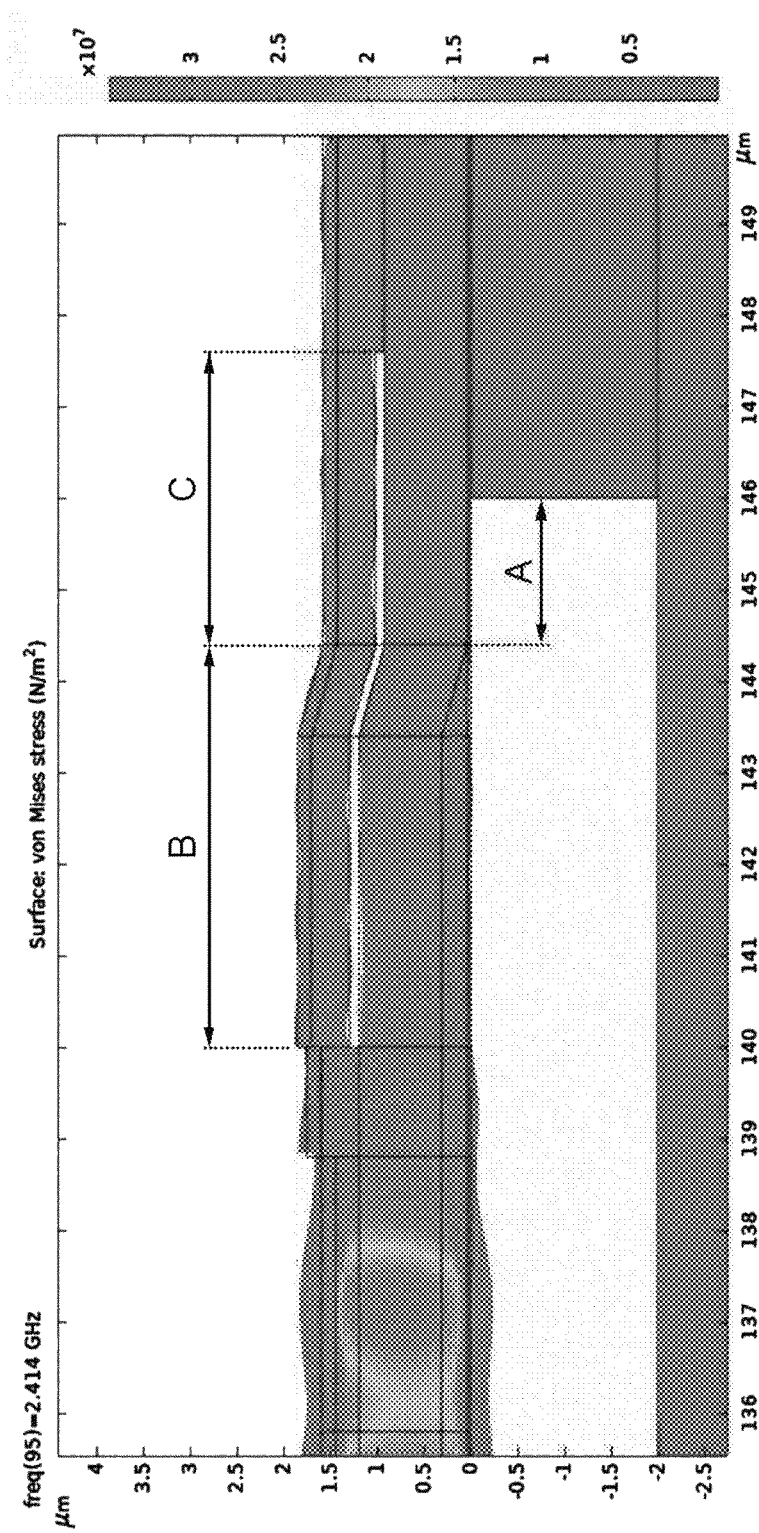
FIG. 4 is a reference view illustrating a relationship among positions of an air-gap portion, a lower electrode, and an air bridge in an air-gap type FBAR of the present invention.

FIG. 4 is a reference view illustrating a relationship among positions of the air-gap portion 110, the lower electrode 200, and the air bridge 500 in the air-gap type FBAR of the present invention.

Referring to FIG. 4, the lower electrode 200 is located inside the air-gap portion 110, and an end of the lower electrode 200 has a tilted shape such that there is a change in thicknesses. The end of the lower electrode 200 having the change in thicknesses corresponds to a position where the Q factor may be maximized. An angle of surface A formed by thickness deviation is to be smaller than or equal to 50 degrees.

Positions of the one side air-gap boundary surfaces 110-11 and 110-21 corresponding to the end of the air-gap portion 110 are located between the other bridge boundary surface 500-2 of the air bridge 500 and the one side plate boundary surfaces 200-11 and 200-21 of the lower electrode 200 and are determined by an acoustic impedance value of a point at which the upper structure and the lower structure of the air bridge 500 meet each other.

The upper structure of the air bridge 500 is designed to have a length to resonate at an anti-resonance frequency. Accordingly, when lengths are equal, the upper structure oscillates greatly in a vertical direction and has a particular wave length. The lower structure of the air bridge 500 structurally has a wave length adequate for a structure at a parallel resonance frequency. However, since the upper structure and the lower structure have different wave lengths, when the wave lengths are integer times, the upper structure and the lower structure send and receive strain energy and block lateral waves.

Also, when the upper structure and the lower structure have the same strain energy, an action of confining such lateral waves is maximized. However, since the upper structure and the lower structure have different thicknesses, the strain energy of the lower structure is greater than that of the upper structure at the end of the air bridge 500.

Due to a change in thicknesses of the lower structure of the air bridge 500, an acoustic impedance change occurs and the strain energy of the lower structure is reduced and becomes equal to the strain energy of the upper structure such that the upper structure and the lower structure of the air bridge 500 send and receive energy to or from each other and block lateral waves so as to resultingly increase the Q factor.

Figure 5:
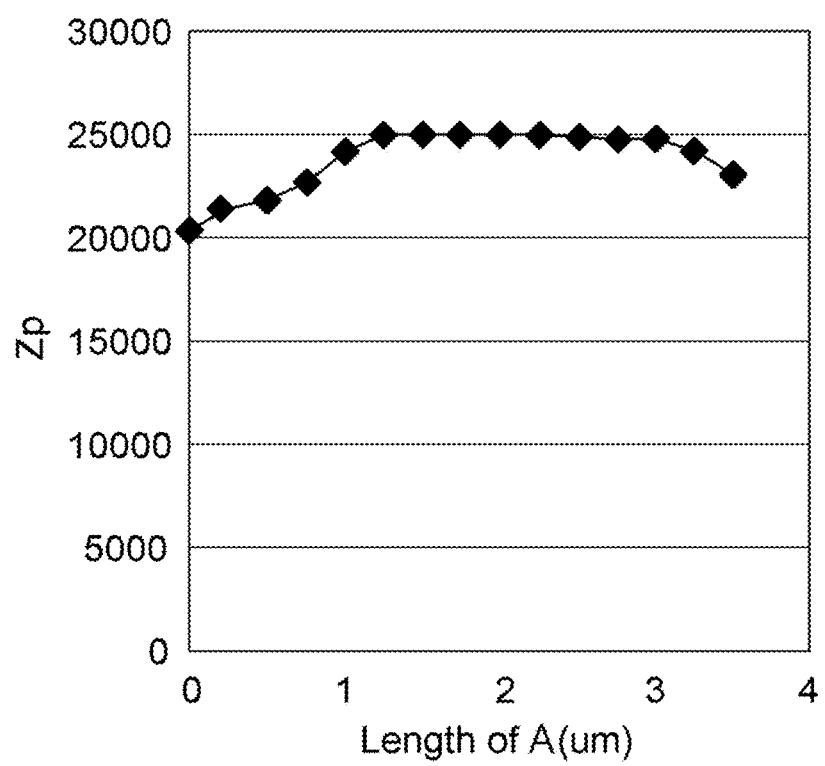
FIG. 5 is a graph illustrating properties of a quality (Q) factor according to a distance between an end of the lower electrode and an end of the air-gap portion in the air-gap type FBAR shown in FIG. 4.

FIG. 5 is a graph illustrating properties of a Q factor according to a distance between the end of the lower electrode and the end of the air-gap portion in the air-gap type FBAR shown in FIG. 4.

Referring to FIG. 5, Q factor qualities of the air-gap portion FBAR may depend on a width of the electrode non-deposited area formed between the one side plate boundary surface of the lower electrode and the one side air-gap boundary surface of the air-gap portion.

Table 1 illustrates properties of Q factors (Zp) according to distances between the one side plate boundary surface of the lower electrode and the one side air-gap boundary surface of the air-gap portion.

TABLE 1

| Distance c (um) | Zp (Ohm) |
| --- | --- |
| 0 | 20300 |
| 0.25 | 21330 |
| 0.5 | 21700 |
| 0.75 | 22530 |
| 1 | 24000 |
| 1.25 | 24990 |
| 1.5 | 24950 |
| 1.75 | 24800 |
| 2 | 24840 |
| 2.25 | 24900 |
| 2.5 | 24720 |
| 2.75 | 24600 |
| 3 | 24600 |
| 3.25 | 24000 |
| 3.5 | 22950 |

As shown in Table 1, it may be seen that the Q factor (Zp) is maximized when the width of the electrode non-deposited area formed between the one side plate boundary surface of the lower electrode and the one side air-gap boundary surface of the air-gap portion is 1.3 μm to 3.0 μm.

Figure 6:
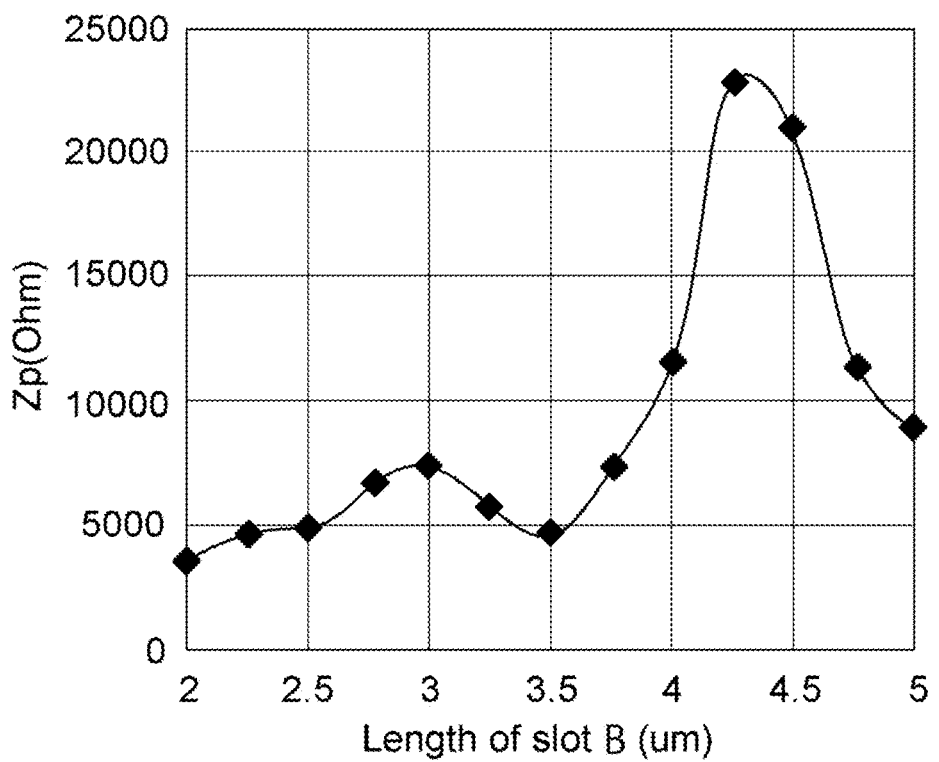
FIG. 6 is a graph illustrating properties of a Q factor according to a distance between one end of the air bridge and the end of the lower electrode in the air-gap type FBAR shown in FIG. 4.

Also, FIG. 6 is a graph illustrating properties of the Q factor according to a distance between one end of the air bridge and the end of the lower electrode in the air-gap type FBAR shown in FIG. 4.

Referring to FIG. 6, the properties of the Q factor of the air-gap type FBAR may depend on the one side bridge boundary surface of the air bridge and the one side plate boundary surface of the lower electrode.

Table 2 illustrates the properties of Q factors (Zp) according to distances between the one side bridge boundary surface of the air bridge and the one side plate boundary surface of the lower electrode.

TABLE 2

| Distance a (um) | Zp (Ohm) |
| --- | --- |
| 2 | 3718 |
| 2.25 | 4808 |
| 2.5 | 4885 |
| 2.75 | 6769 |
| 3 | 7695 |
| 3.25 | 5673 |
| 3.5 | 4699 |
| 3.75 | 7409 |
| 4 | 11660 |
| 4.25 | 22650 |
| 4.5 | 20913 |
| 4.75 | 11348 |
| 5 | 8755 |

As shown in Table 2, it may be seen that a Q factor (Zp) is high when a distance between the one side bridge boundary surface of the air bridge and the one side plate boundary surface of the lower electrode is 4.0 μm to 4.7 μm, and particularly, a Q factor (Zp) is highest when a distance is 4.25 μm.

Figure 7:
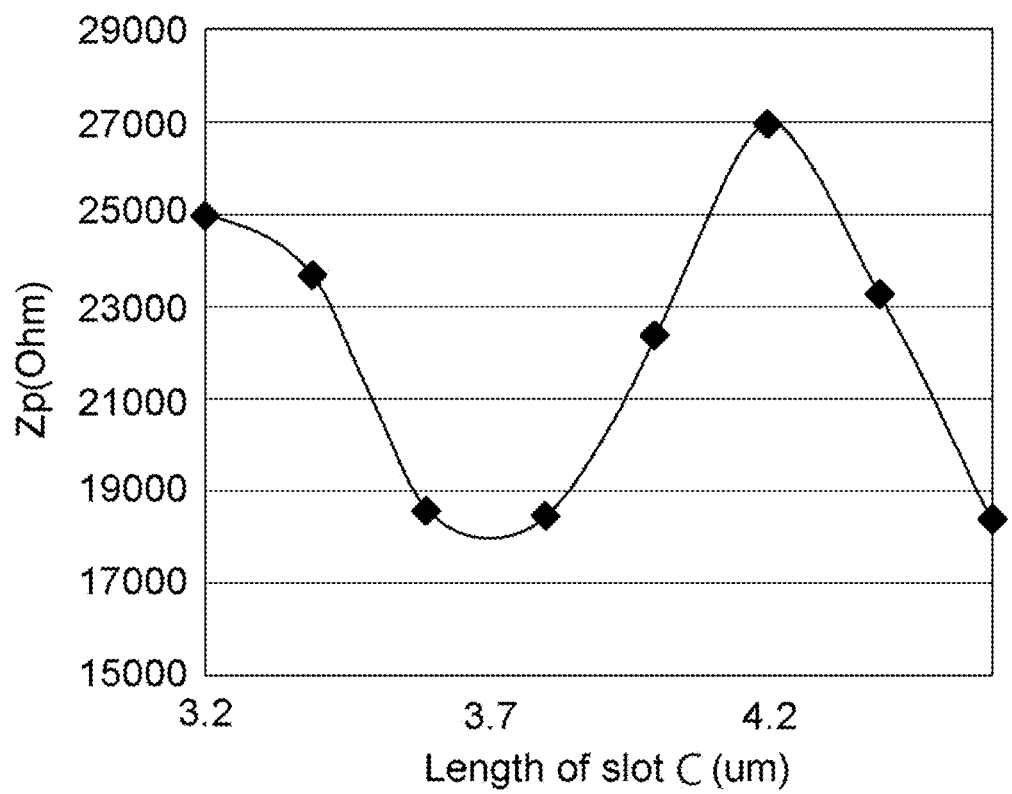
FIG. 7 is a graph illustrating properties of a Q factor according to a distance between the end of the lower electrode and the other end of the air bridge in the air-gap type FBAR shown in FIG. 4.

Also, FIG. 7 is a graph illustrating properties of the Q factor according to a distance between another end of the air bridge and the end of the lower electrode in the air-gap type FBAR shown in FIG. 4.

Referring to FIG. 7, properties of a Q factor of the air-gap type FBAR depends on a distance between the end of the lower electrode and the other end of the air bridge.

Table 3 illustrates properties of Q factors (Zp) according to a distance between the end of the lower electrode and the other end of the air bridge.

TABLE 3

| Distance b (um) | Zp (Ohm) |
| --- | --- |
| 3.2 | 24966 |
| 3.4 | 23490 |
| 3.6 | 18466 |
| 3.8 | 18311 |
| 4 | 22177 |
| 4.2 | 26611 |
| 4.4 | 23042 |
| 4.6 | 18182 |

As shown in Table 3, it may be seen that a Q factor (Zp) is high when a distance between the end of the lower electrode and the other end of the air bridge is 4.0 μm to 4.5 μm, and particularly, a Q factor (Zp) is highest when a distance is 4.2 μm.

According to the present invention, a quality (Q) factor may be improved by allowing an end part of a lower electrode to be located inside an air-gap portion.

Also, according to the present invention, since an escape of lateral waves may be prevented by using structural resonance of an upper structure and a lower structure of an air bridge, a Q factor may be improved. A filter using a resonator may improve an insertion loss and skirt properties of the filter.

The exemplary embodiments of the present invention have been described above. It should be understood by one of ordinary skill in the art that modifications may be made without departing from the essential features of the present invention. Therefore, the disclosed embodiments should be considered not in a limitative view but a descriptive view. The scope of the present invention will be shown in the claims not in the above description, and all differences within an equivalent range thereof should be construed as being included in the present invention.

What is claimed is:

1. An air-gap type film bulk acoustic resonator (FBAR) comprising:
a substrate comprising an air-gap portion on a top surface;
a lower electrode having a polygonal plate shape above the substrate and configured to surround a top of the air-gap portion;
a piezoelectric layer formed above the lower electrode; and
an upper electrode formed above the piezoelectric layer,
wherein the lower electrode comprises an electrode non-deposited area formed between one side plate boundary surface of the polygonal plate and one side air-gap boundary surface of the air-gap portion to expose one part of a top of the air-gap portion,
wherein a part of the one side plate boundary surface forms a groove with a certain width in a direction toward a center of the air-gap portion to form the electrode non-deposited area between the one side plate boundary surface and the one side air-gap boundary surface.

2. An air-gap type film bulk acoustic resonator (FBAR) comprising:
a substrate comprising an air-gap portion on a top surface;
a lower electrode having a polygonal plate shape above the substrate and configured to surround a top of the air-gap portion;
a piezoelectric layer formed above the lower electrode; and
an upper electrode formed above the piezoelectric layer,
wherein the lower electrode comprises an electrode non-deposited area formed between one side plate boundary surface of the polygonal plate and one side air-gap boundary surface of the air-gap portion to expose one part of a top of the air-gap portion,
wherein a part of the one side air-gap boundary surface protrudes with a certain width in a direction opposite to a center of the air-gap portion to form the electrode non-deposited area between the one side plate boundary surface and the one side air-gap boundary surface.

3. The air-gap type FBAR according to claim 1, wherein the certain width is 0.5 μm to 5.0 μm.

4. The air-gap type FBAR according to claim 2, wherein the certain width is 0.5 μm to 5.0 μm.

5. An air-gap type film bulk acoustic resonator (FBAR) comprising:
a substrate comprising an air-gap portion on a top surface;
a lower electrode having a polygonal plate shape above the substrate and configured to surround a top of the air-gap portion;
a piezoelectric layer formed above the lower electrode; and
an upper electrode formed above the piezoelectric layer,
wherein the lower electrode comprises an electrode non-deposited area formed between one side plate boundary surface of the polygonal plate and one side air-gap boundary surface of the air-gap portion to expose one part of a top of the air-gap portion,
wherein the air-gap type FBAR further comprising an air bridge in which an air space is formed between the piezoelectric layer and the upper electrode above the electrode non-deposited area.

6. The air-gap type FBAR of claim 5, wherein a distance between the one side plate boundary surface and one side bridge boundary surface of the air bridge located above the air-gap portion is 2.0 μm to 6.0 μm.

7. The air-gap type FBAR of claim 5, wherein one side bridge boundary surface of the air bridge is located above the air-gap portion, and another side bridge boundary surface of the air bridge is located above the substrate where the air-gap portion is not formed.

\* \* \* \* \*